(12) United States Patent
Umeyama et al.

(10) Patent No.: US 6,222,415 B1
(45) Date of Patent: Apr. 24, 2001

(54) MAGNETO-RESISTIVE ELEMENT SIGNAL AMPLIFYING CIRCUIT

(75) Inventors: Takehiko Umeyama; Toru Takeuchi, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/494,403

(22) Filed: Jan. 31, 2000

(30) Foreign Application Priority Data

Aug. 27, 1999 (JP) .................................................. 11-241694

(51) Int. Cl.$^7$ ....................................................... H03F 3/45

(52) U.S. Cl. .............................. 330/252; 330/261; 360/67

(58) Field of Search ..................................... 330/252, 261; 360/67, 68

(56) References Cited

U.S. PATENT DOCUMENTS

| | | | |
|---|---|---|---|
| 4,712,144 | * 12/1987 | Klaassen | 360/67 |
| 4,716,306 | * 12/1987 | Sato et al. | 307/296 R |
| 6,066,987 | * 11/2000 | Lorenz | 330/311 |
| 6,114,905 | * 11/2000 | Hashimoto et al. | 330/252 |
| 6,147,824 | * 11/2000 | Shibasaki et al. | 360/46 |
| 6,154,333 | * 11/2000 | Narusawa et al. | 360/67 |

FOREIGN PATENT DOCUMENTS 117601   1/1999   (JP) .

* cited by examiner

*Primary Examiner*—Robert Pascal
*Assistant Examiner*—Henry Choe
(74) *Attorney, Agent, or Firm*—Leydig, Voit & Mayer, Ltd.

(57) ABSTRACT

In the bias circuit of a magneto-resistive element signal amplifying circuit, a favorable high frequency characteristic is obtained by suppressing the influence of a parasitic capacitance that is generated. Furthermore, noise is removed by a lowpass filter including a resistor and a capacitor having a relatively small size in an integrated circuit.

12 Claims, 8 Drawing Sheets

MAGNETO-RESISTIVE ELEMENT SIGNAL AMPLIFYING CIRCUIT

FIELD OF THE INVENTION

The present invention relates to a magneto-resistive (MR) element signal amplifying circuit. More particularly this invention relates to an MR element signal amplifying circuit that is excellent in a high frequency characteristic. Furthermore, the present invention relates to an MR element signal amplifying circuit swiftly changing a bias current of the MR element and protecting the MR element.

BACKGROUND OF THE INVENTION

In recent years, an MR element has been widely used as an element for use in a head of a magnetic recording medium such as a hard disk drive, a floppy disk drive or the like. The head using the MR element has a large reproduction output as compared with a head using a conventional thin film element. Further, this head is capable of largely improving surface recording density of the magnetic recording medium.

The MR element according to the present invention refers to elements as a whole showing a magneto-resistive effect wherein the resistance changes with an application of an outside magnetic field. For example, the MR element includes a GMR (giant magneto-resistive) element or a TMR (tunneling magneto-resistive) element.

FIG. 9 shows an MR bias current circuit on the conventional read amplifier circuit input stage described in the Japanese Patent Application Laid-Open No. 11-7601.

In FIG. 9, reference numeral 1 denotes an MR element, 2 a differential amplifying circuit, 3 a feed-back circuit, 4a and 4b lowpass filters, 5a and 5b MOS transistors, 6a and 6b rectified current circuits, 7a and 7b capacitors, and 8a, 8b, 16 and 17 resistors.

Advantages and operations of the conventional technology are explained below. The bias current Imr of the MR element 1 is set in the following manner.

A PMOS transistor M2 and an NMOS transistor M8 are arranged on both ends of the MR element 1. A rectified current Ib that is supplied from the rectified current source 6a is allowed to flow to the NMOS transistor M4 that is diode connected. The NMOS transistor M4 and the NMOS transistor M8 constitute a current mirror circuit, and MR bias current Imr which depends on the rectified current Ib is allowed to flow to the NMOS transistor M8. The NMOS transistor M4 and the NMOS transistor M6 constitute the current mirror circuit, and the rectified current Im6 is allowed to flow to the NMOS transistor M6. The rectified current Im6 is allowed to flow from the PMOS transistor M1 which is diode connected. Sum of the rectified current Im6 and the collector current Iq1 of the NPN transistor Q1 represented by an expression Im1=Im6+Iq1 flows through the PMOS transistor M1. A current which is the same as the MR bias current Imr which flows through the NMOS transistor M8 flows through the PMOS transistor M1 and the PMOS transistor M2 which constitute the current mirror circuit.

On the node A to which the gate terminals of the PMOS transistor M1 and the PMOS transistor M2 are connected, a lowpass filter 4a which comprises the resistor 8a and the capacitor 7a is arranged so that a noise of the gate voltage of the node A is eliminated and the noise of the MR bias current Imr is lowered. The input impedance of the MOS transistor of the power source is sufficiently large because of the characteristics of the MOS transistor so that a combination of the lowpass filter can be realized which can decrease the capacitance by enlarging the resistance. The capacitance of the lowpass filter can be incorporated in the semiconductor apparatus. In a similar manner, the gate voltage of the node B is such that the noise component is removed with the lowpass filter 4b which comprises the resistor 8b and the capacitor 7b, and the noise of the MR bias current Imr is lowered.

The bias current Imr of the MR element 1 which is set in this manner is such that the resistance of the MR element 1 changes in accordance with a signal from a magnetic disc which is not shown here, and the voltage difference between the two ends of the MR element 1 is input to the differential amplifying circuit 2. The differential amplifying circuit 2 sets the direct current-like differential output voltage to zero so that only the alternate current-like component is amplified to be output to the latter stage circuit.

Furthermore, along with an increase in the density of the magnetic disc apparatus, a distance between the MR head for detecting the magnetic signal and the magnetic disc becomes very small (1 μm or less) so that the MR head and the magnetic head contact each other very frequently. Since the DC voltage of the MR element changes according to the MR bias current Imr, there is a fear that an over-current flows through the MR element at the time of the short circuit of the MR element and the GND potential (which occurs when the MR head and the magnetic disc contact each other) with the result that the MR element is damaged. As a countermeasure against such phenomenon, the mid-point potential of the MR element is maintained at the GND potential in the following manner.

The node C, which is equal to the mid-point potential of the MR element because of the two resistors 16 and 17 which have the same size, is connected to one of the input terminals of the differential amplifying circuit which constitutes a feed-back circuit 3 while the other input terminal of the differential amplifying circuit is connected to the GND potential. The feed-back circuit 3 comprises a pair of NPN transistors Q1 and Q2 and the current source 6b. The collector of Q1 is connected to the node D while the collector of Q2 is connected to Vcc line. When the potential of node C is higher than the GND potential, the collector currents Iq1 of Q1 and Im1 decrease and the MR bias current which flows through the transistor M2 decreases with the result that the potential of the node C is lowered and is maintained at the GND potential. On the contrary, when the potential of the node C is lower than the GND potential, currents Iq1 and Im1 increase and the MR bias current increases with the result that the potential of the node C rises and is maintained at the GND potential.

The conventional MR element signal amplifying circuit is constituted in the manner described above, and it is required that the MOS transistors M2 and M8 which allow the MR bias current Imr to flow should be of relatively larger size because a current of the order of several mA is required to flow as the MR bias current Imr. If the MOS transistors M2 and M8 have a large size, since the drains of the MOS transistors M2 and M8 are connected to the two terminals of the MR element, capacitance between the drain and the gate of the MOS transistors M2 and M8, namely a parasitic capacitance, is generated between the drain and the substrate. Thus, there arises a disadvantage that the frequency characteristic in a high frequency region is deteriorated.

SUMMARY OF THE INVENTION

The present invention has been made to solve the problems described above. It is an object of this invention to provide an MR element bias current circuit which is capable of taking out a stable signal which varies a little against a high frequency input signal by suppressing an influence of a parasitic capacitance that is generated in the bias circuit and which is capable of removing noises at a sufficiently low cut-off frequency by the constitution of a lowpass filter comprising a resistor, and a capacitor having a relatively small size inside of the IC.

In addition, the circuit of the invention is constituted in such a manner that at the time of the short circuit of the MR element and the GND potential which short circuit occurs when the MR head and the recording medium such as a magnetic disc or the like contact each other, an over-current flows through the MR element so that the mid-point of the MR element is constantly maintained at the GND potential so as not to cause damage to the MR element.

In the MR element signal amplifying circuit according to one aspect of the present invention, a first resistor is connected to one end and a second resistor is connected to the other end of an MR element and the remaining ends of the first and the second resistors are connected to the source terminal of the MOS transistor. Therefore, a stable signal which varies a little with respect to the input signal having a high frequency can be taken out.

In the MR element signal amplifying circuit according to another aspect of the present invention, a plurality of MR elements are provided, a first resistor is connected to one end and the second resistor to the other end of each of the plurality of MR elements and the remaining ends of the first and the second resistor are connected to the source terminal of the MOS transistor. Furthermore, a selection circuit is provided which selects one of the plurality of MR elements and amplifies the signal of this MR element. Therefore, a stable signal which varies a little with respect to the input signal having a high frequency can be taken out from the plurality of the MR element.

Other objects and features of this invention will become apparent from the following description with reference to the accompanying drawings.

DESCRIPTION OF THE PREFERRED EMBODIMENTS

The first Embodiment of the present invention will be explained with the help of drawings.

Figure 1:
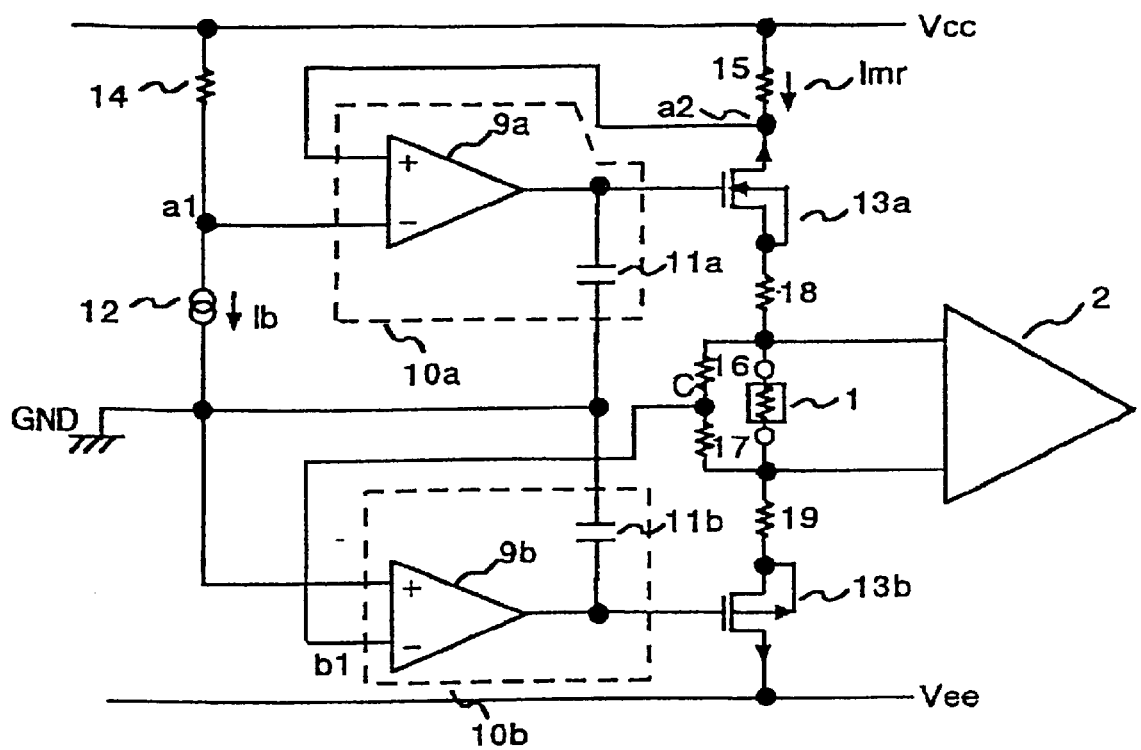
FIG. 1 is a circuit diagram showing a differential amplifying circuit according to a first embodiment of the present invention.
Figure 9:
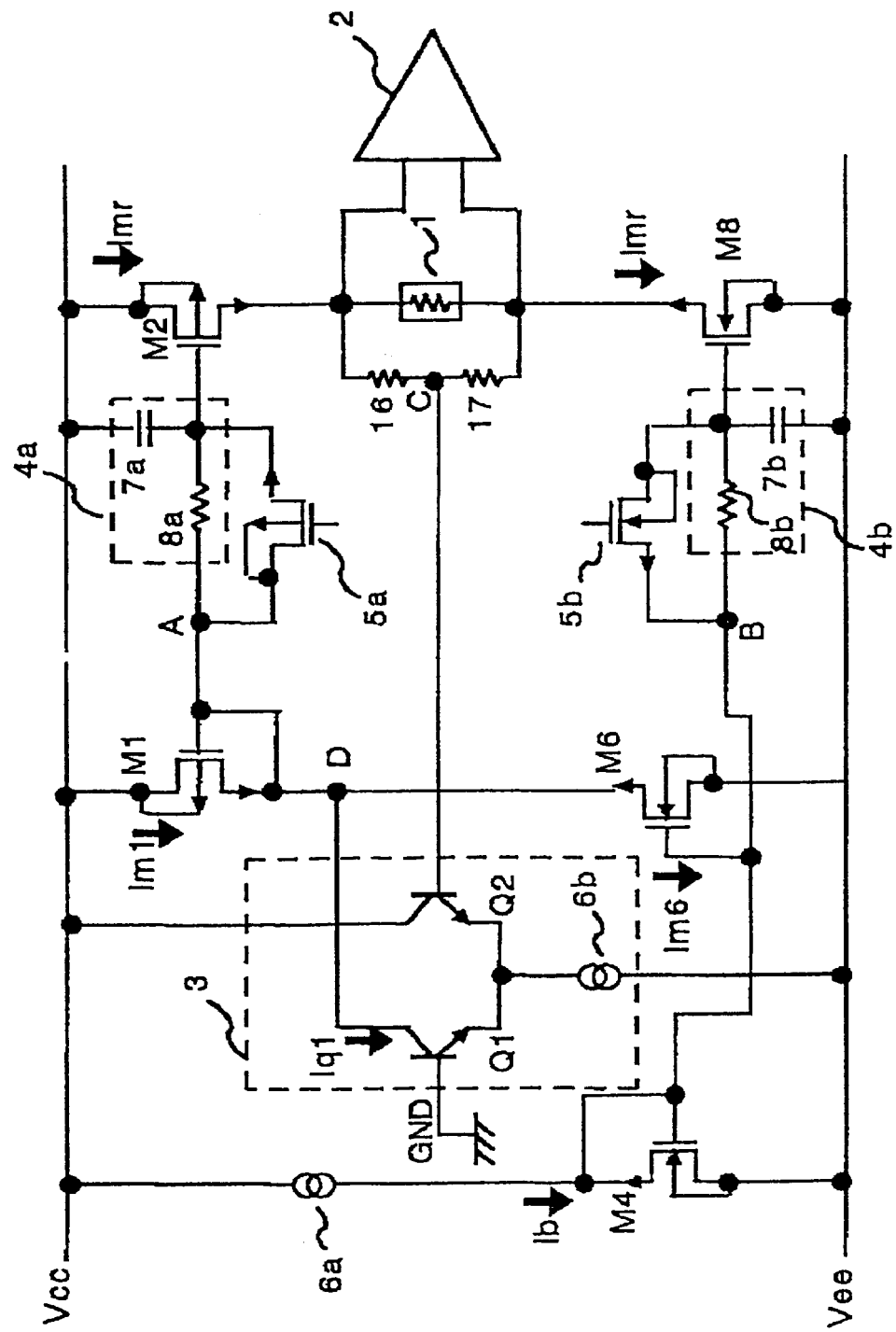
FIG. 9 is a circuit diagram showing a conventional differential amplifying circuit.

In FIG. 1, reference numeral 1 denotes an MR element, reference numeral 2 denotes a differential amplifying circuit, reference numerals 16 and 17 denote resistors. These components are the same as those shown in FIG. 9 showing the conventional structure. Furthermore, reference numerals 9a and 9b denote trans-conductance amplifiers which are a kind of a differential amplifying circuit. Reference numerals 10a and 10b denote lowpass filers comprising capacitors 11a and 11b and trans-conductance amplifiers 9a and 9b. Reference numeral 12 denotes a rectified current circuit. Reference numerals 13a and 13b denote MOS transistors, and reference numerals 14, 15, 18 and 19 denote resistances.

Advantages and operations of the present invention will be explained below with respect to the first embodiment of the present invention.

In the beginning, a current Ib is allowed to flow with the rectified current source 12 through the resistor 14 (having a resistance R1) and the rectified current source 12 with respect to the GND potential which is the ground potential from the high potential power source line Vcc. A feed-back is then applied with the trans-conductance amplifier 9a to the gate voltage of the NMOS transistor 13a so that the nodes a1 and a2 are maintained at the same potential. A current Imr (=Ib* R1/R2)is allowed to flow through the resistor 15 (having a resistance R2). When the current Ib is changed over here, the current Imr is also changed over in accordance with the equation described above.

The trans-conductance amplifier 9a is a kind of the differential amplifier circuit wherein an output section is taken from the collector of the transistor. The trans-conductance amplifier 9a has a large output impedance, and has a characteristic of converting and outputting a differentially input voltage. Furthermore, when the capacitor 11a is connected to the output terminal of this trans-conductance amplifier 9a, a lowpass filter 10a can be constituted.

Figure 2:
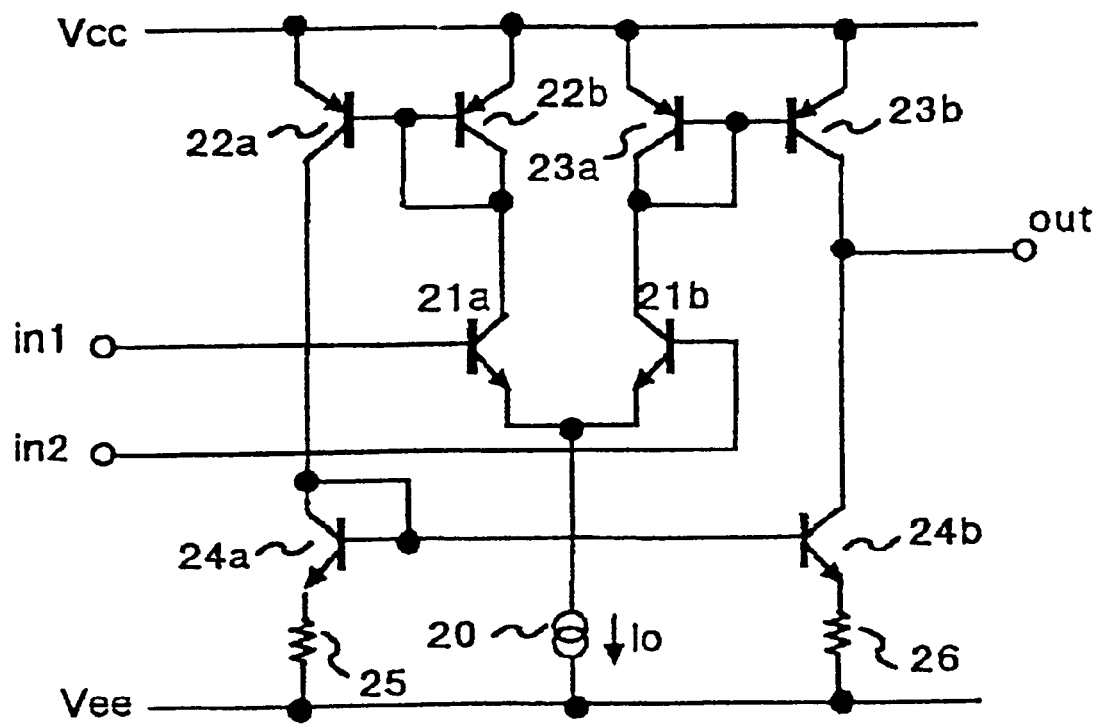
FIG. 2 is a circuit diagram showing a structure of a trans-conductance amplifier.
Figure 2:
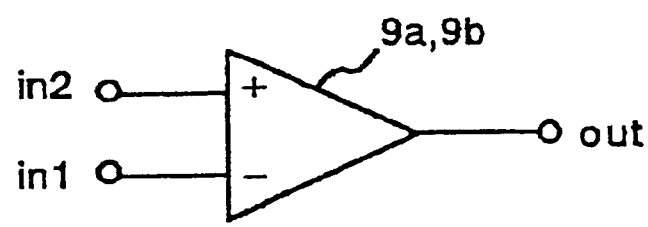

This trans-conductance amplifier 9a can be constituted with the circuit shown, for example, in FIG. 2. This trans-conductance amplifier 9a becomes an active filter that is capable of changing the cut-off frequency by changing over the current Io that flows through the rectified current circuit 20 in FIG. 2. In FIG. 2, reference numerals 21a, 21b, 22a, 22b, 23a, 23b, 24a and 24b denote transistors. Reference numerals 25 and 26 denote resistors. As a method for changing over the current Io, as shown in the circuit of FIG. 3, the MOS transistor 28 is connected to the base of the transistor 29a of the current mirror circuit which pulls the current as Io with the result that the current Io can be changed over with ON/OFF of the current mirror circuit.

Figure 3:
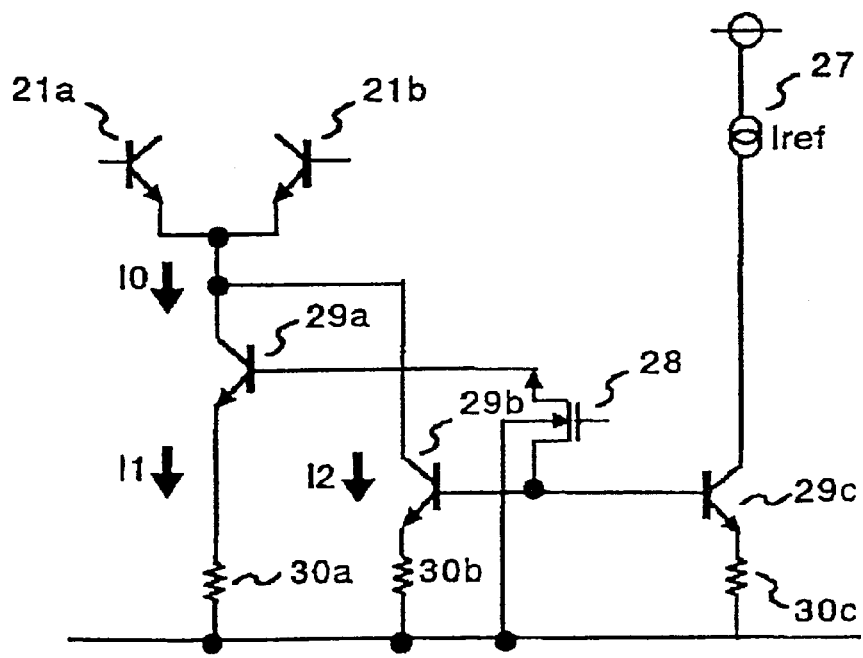
FIG. 3 is a circuit diagram showing a structure for changing over a current.

In other words, when the MOS transistor 28 shown in FIG. 3 is turned on, the current Io becomes I1+I2 whereas the current Io becomes I2 when the MOS transistor 28 is off.

Referring back to FIG. 1, resistors 18 and 19 prevent the capacitance between the source and the gate of the MOS transistors 13a and 13b, namely the capacitance between the source and the substrate, from parasitically settling on both ends of the MR element 1. The resistors 18 and 19 decrease the input capacitance of the lead signal input terminal of the MR element 1, and at the same time, improve the frequency characteristic in the high frequency region. The improvement of the frequency characteristic in the high frequency region with this circuit constitution will be explained below with a comparison with FIG. 9 showing the conventional technology.

Figure 4:
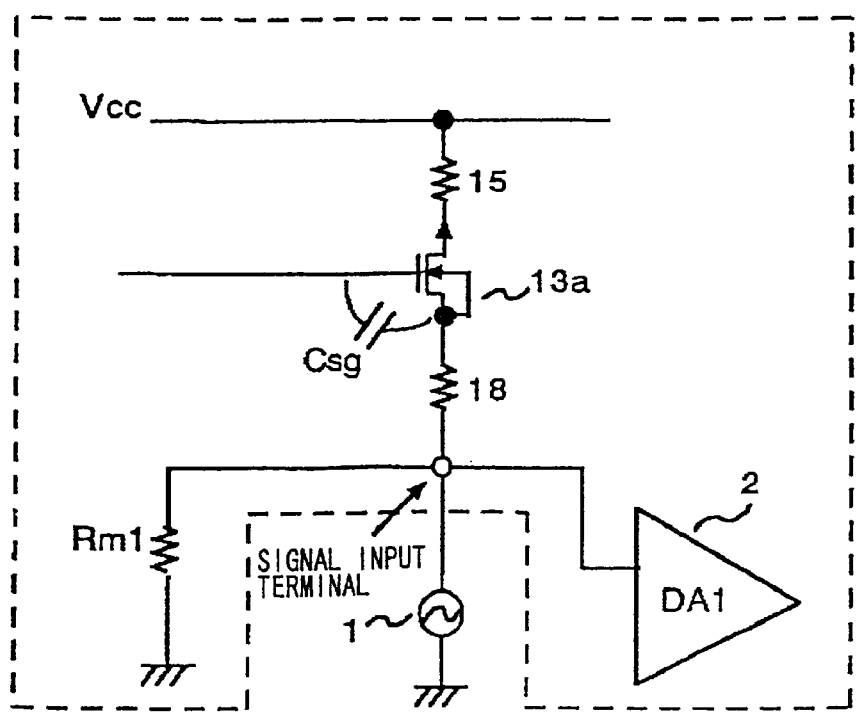
FIG. 4 is a circuit diagram showing a signal input terminal on the positive side in the differential amplifying circuit according to the first embodiment of the present invention.

FIG. 4 is a view showing a signal input section on the positive side by using the MR element 1 as a signal source in FIG. 1. In FIG. 4, the input section of the differential amplifying circuit 2 becomes a base input of the npn transistor, and the input resistance is large with respect to Rm1 and hence can be ignored. Furthermore, the capacitance Csg between the source and drain parasitically settles on the source of the MOS transistor 13a. Furthermore, as seen from the source, the gate has an output resistance of 1/gm. Since the gate of the MOS transistor 13a is grounded in terms of an alternate current, a small signal equivalent circuit of the signal input terminal from the MR element 1 can be represented in FIG. 5.

Figure 5:
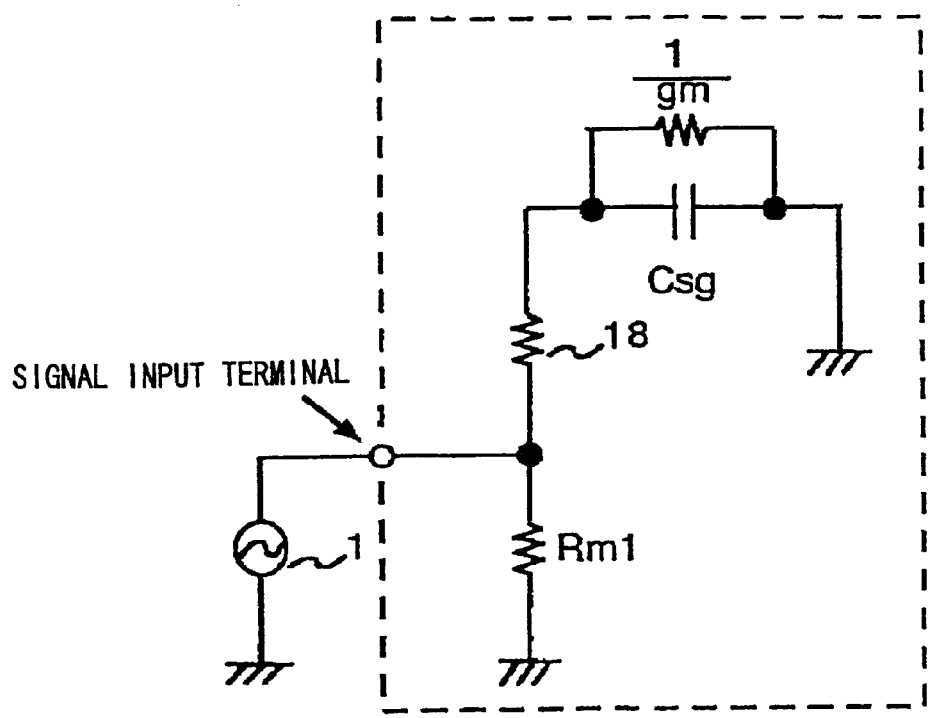
FIG. 5 is a small equivalent circuit diagram of signal input terminal on the positive side in the differential amplifying circuit according to the first embodiment of the present invention.

From FIG. 5, the input impedance Rin1 of the signal input terminal can be represented as in the following equation (1). In this equation R11 denotes resistance of the resistor 18, Rm1 denotes resistance of the resistors 16 and 17.

$$Rin1 = \left[Rm1 // \left\{R11 + \left(\frac{1}{gm} // \frac{1}{j\omega C_{sg}}\right)\right\}\right] \quad (1)$$

Where, for instance A//B denotes (A×B)/(A+B)

Value of gm will be determined below. The drain current ID in a saturated region (a region between five poles) of the CMOS transistor can be represented as in the following equation (2) with the voltage VGS between the gate and the source, and the voltage VDS between the source and the drain.

$$ID = \frac{\beta}{2}(V_{GS} - V_{TH})^2 \quad (2)$$

VTH is a threshold voltage and β can be represented as in the following equation (3).

$$\beta = \frac{W}{L}\mu Co \quad (3)$$

Where W is gate width, L is gate length, $\mu$ is average electron movement degree of channel, and Co is gate oxide film capacitance per unit area.

When such values as $\mu$=700 cm2/V·sec, Co=1.92×10$^{-7}$ [F/cm2] are inserted in the equation (3), the following equation (4) is obtained.

$$\frac{1}{gm} = \sqrt{\frac{1}{2ID\beta}} = \sqrt{\frac{L}{W} \times \frac{1}{ID}} \times 19.3[\Omega] \quad (4)$$

When the values of ID, W/L are set to sufficiently large values, 1/gm acquires a value of the order of more than ten Ω with the result that the influence of the parasitic capacitance Csg is decreased, and the frequency characteristic can be reduced in the usage frequency region.

Figure 6:
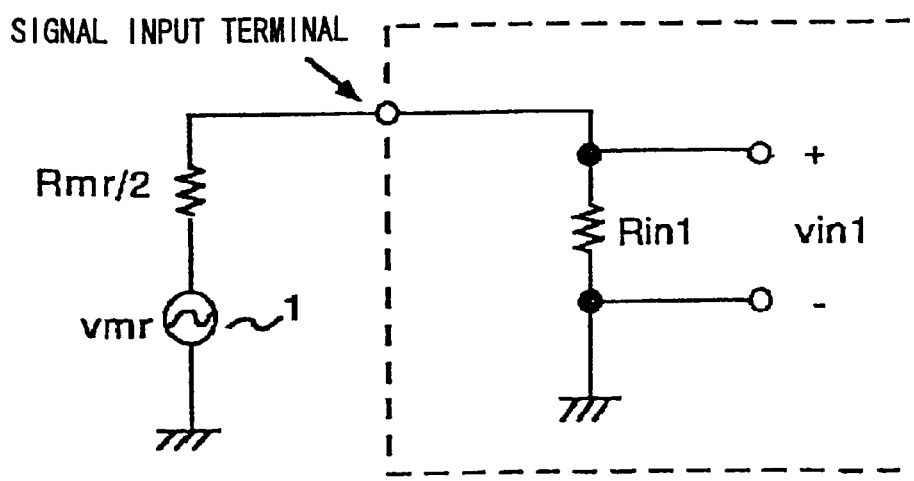
FIG. 6 is an equivalent circuit diagram in consideration of an output resistance in a small signal equivalent circuit diagram of a signal input terminal on the positive side in the differential amplifying circuit according to the first embodiment of the present invention.

Since the MR element 1 has a resistance of the order of more than ten Ω, an equivalent circuit drawn in consideration of the output resistance is shown in FIG. 6. Here, Rmr donates the resistance of the MR element 1.

From FIG. 6, the signal input vin1 with respect to the alternate current signal vmr from the MR element 1 can be obtained according to the following equation (5).

$$Vin1 = \frac{Rin1}{Rmr/2 + Rin1} vmr \quad (5)$$

When representative specific values (such as Imr=5 mA, Rmr=50Ω, Csg=5 pF, resistance of the resistor 18=200Ω, W=3000 um, L=0.8 um) are inserted in equation (5) to calculate the frequency characteristic of vin1 with respect to vmr, the result shown in table 1 are obtained.

TABLE 1

| Frequency | \| vin1 \|/\| vmr \| |
|---|---|
| 1 MHz | 0.895434 |
| 10 MHz | 0.895434 |
| 100 MHz | 0.895423 |
| 500 MHz | 0.895164 |

In this manner, the value of |vin1|/|vmr| is suppressed to a variation of not more than 0.1% with respect to the value at the time of 1 MHz even at the time of 500 MHz. It can be said that virtually no change is observed in the frequency characteristic within the usage area from tens of MHz to hundreds of MHz.

This characteristic is the same with respect to the negative side and virtually no change is observed.

In the description given above, there is shown that the MR element signal amplifying circuit of the present invention is excellent in the frequency characteristic by giving specific examples. For comparison, a similar frequency characteristic in the structure shown in FIG. 9, which is a conventional example will be shown.

Figure 10:
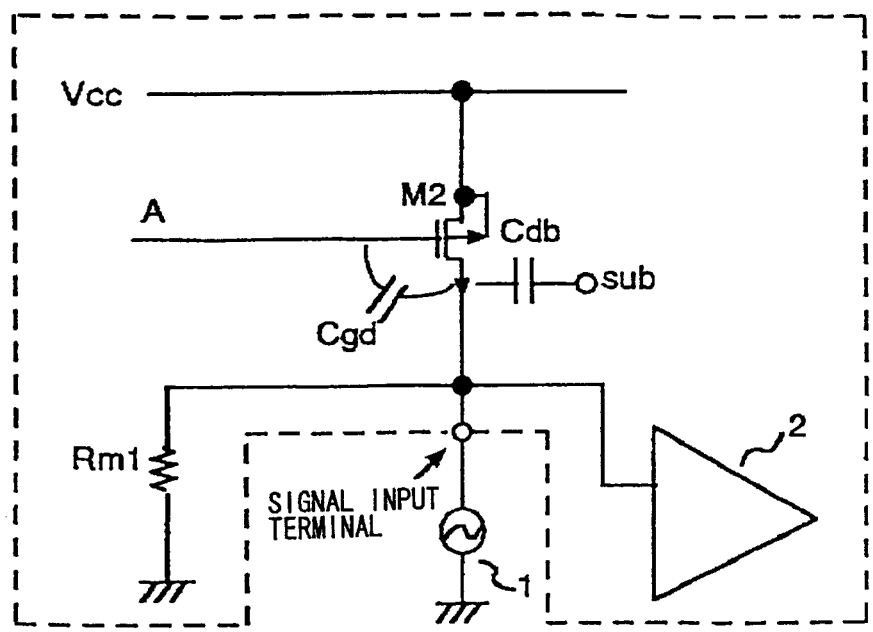
FIG. 10 is a circuit diagram showing a signal input section on the positive side in the conventional differential amplifying circuit.

FIG. 10 is a view showing a signal input section on the positive side by using the MR element 1 as a signal source shown in FIG. 9, the view corresponding to FIG. 4 in the present invention. In FIG. 10, the input section of the differential amplifying circuit 2 becomes a base input of the npn transistor, and the input resistance is large with respect to Rm1 and hence it can be ignored. Furthermore, since the output resistance when the gate is observed from the drain is also large with respect to Rm1 it can be ignored. Furthermore, a parasitic capacitance Cgd between the gate and the drain, and the capacitance Cdb between the drain and the substrate parasitically settle on the drain terminal of the MOS transistor M2. Since the gate of the MOS transistor M2 is grounded in an alternate current manner with respect to the high frequency signal, and the substrate is connected to a high voltage power source Vcc and is grounded in an alternate current manner, the small signal equivalent circuit of the signal input terminal can be represented .as in FIG. 11.

Incidentally, a relation of Cd=Cgd+Cdb is established.

Figure 11:
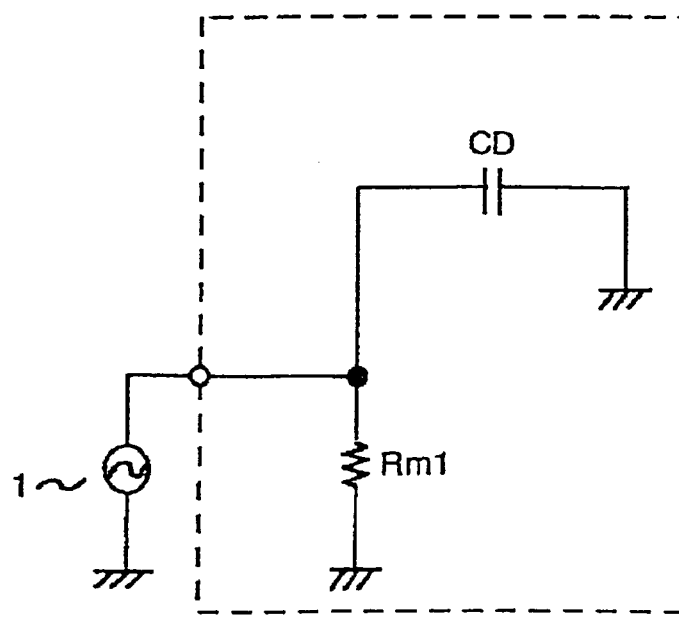
FIG. 11 is a small signal equivalent circuit diagram of the signal input terminal on the positive side in the conventional differential amplifying circuit.

In FIG. 11, the input impedance Rin2 of the signal input terminal of the circuit of FIG. 10 can be represented as in the following equation (6).

$$Rin2 = \left( Rm1 // \frac{1}{j\varpi CD} \right) \quad (6)$$

The value of Rm1 in equation (6) is a resistance of the order of several kΩ, and a representative capacitance of the capacitor Cd is 10 to 20 pF. When the frequency of the input signal becomes high and the impedance of the capacitor Cd becomes small, the item Cd becomes dominant in the input impedance of the equation (6) (when f=100 MHz, the impedance becomes 75 to 150Ω).

When the equivalent circuit is drawn in consideration of the output resistance because the MR element 1 has as a resistance component of the order of more than ten Ω, the circuit can be drawn as in FIG. 6 in the same manner as has been explained in the structure of the present application. From FIG. 6, the signal vin1 input with respect to the alternate current signal vmr from the MR element 1 is as shown in the equation (5) explained above.

When representative specific values (such as Imr=5 mA, Rmr=50Ω, Cdg=Cdb=5 pF, Rm1=5 kΩ) are inserted in equation (5) to calculate the frequency characteristic of vin1 with respect to vmr, the result shown in table 2 is given when an expression of Rm1+Rmr/2≈Rm1 is calculated in an approximate manner on the basis of Rm1>>Rmr.

TABLE 2

| Frequency | \| vin1 \|/\| vmr \| |
|---|---|
| 1 MHz | 0.999999 |
| 10 MHz | 0.999877 |
| 100 MHz | 0.987899 |
| 500 MHz | 0.786591 |

Thus, it is clear that the value of |vin1|/|vmr| is decreased by 1.2% at 100 MHz and by 20% at 500 MHz when the value at the time of 1 MHz is set to 1, and the input signal in the high frequency region is reduced.

This characteristic is the same on the negative side, and the input signal in the high frequency region becomes small.

As has been explained above, it can be said that the MR element signal amplifying circuit of the present invention is excellent in the frequency characteristic as compared with the conventional MR element signal amplifying circuit.

Incidentally, in FIG. 9 showing the conventional circuit, the high frequency characteristic cannot be improved only by simply providing a resistor on both sides of the MR element 1. The reason is that since a current of several mA is required to be flowed as Imr so that a large resistor cannot be provided (a resistor having a resistance of about several hundred Ω can at most be provided), the influence of the parasitic capacitance cannot be completely eliminated.

Referring back to FIG. 1, the node b1 which is equal to the mid-point (node C) potential of the MR element 1 due to the two resistors 16 and 17 having an equal size is maintained at the GND potential by the trans-conductance amplifier 9b. In other words, the gate voltage of the MOS transistor 13b is fed back so that the node b1 is maintained at the GND potential by the output voltage of the trans-conductance amplifier 9b. As a consequence, the mid-point potential of the MR element 1 is maintained at the GND potential with the result that no over-current flows through the MR element 1 at the time of the short circuit of the MR element 1 and the GND potential, and the MR element 1 is protected.

In this manner, the MR bias current Imr flows through the resistor 15, the MOS transistor 13a, the resistor 18, the MR element 1, the resistor 19 and the MOS transistor 13b from high potential power source line Vcc to the low potential power source line Vee. The potential difference between the two ends of the MR element 1 which is caused by the variation in resistance at the MR element 1 is input to the differential amplifying circuit 2 and an alternate current component thereof is output from the differential amplification circuit 2.

Two lowpass filters 10a and 10b comprising a capacitor 11a and a trans-conductance amplifier 9a, and a capacitor 11b and a trans-conductance amplifier 9b remove noises caused by the MR bias current Imr. It is possible to realize the trans-conductance amplifiers 9a and 9b, and the capacitors 11a and 11b in a relatively small area on the semiconductor integrated circuit. The two trans-conductance amplifiers 9a and 9b can be formed in the same IC together with the MR bias circuit as the lowpass filters 10a and 10b.

Furthermore, the cut-off frequency of the lowpass filter can be changed according to the current Io that is allowed to flow by the rectified current source 20 of FIG. 2 as explained above. Consequently, when the MR bias current Imr is changed over, a swift change-over of the MR bias current Imr can be realized by heightening the cut-off frequency (by increasing Io) at the time of the change-over from the reading time to the writing time.

As has been explained above, according to the first embodiment of the present invention, a stable signal which varies a little with respect to the high frequency input signal can be taken out. Further, a bias current circuit of the MR element can be obtained which removes noises at a sufficiently low cut-off frequency by constituting inside of an IC a lowpass filter comprising a trans-conductance amplifier and a capacitor having a relatively small size.

Figure 7:
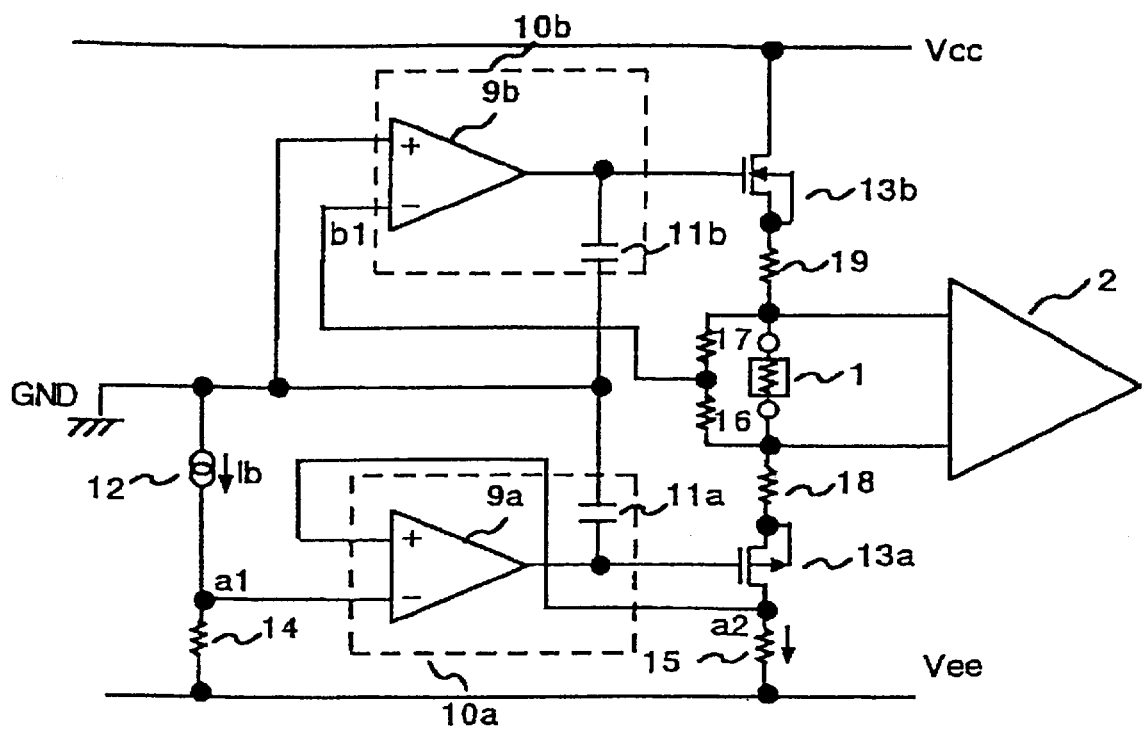
FIG. 7 is a circuit diagram showing a differential amplifying circuit according to a second embodiment of the present invention.

The second embodiment of the present invention will be explained with the help of FIG. 7.

In FIG. 1 showing the first embodiment, the lowpass filter 10a for removing noises is arranged on the side of the high voltage power source Vcc with respect to the MR element 1. Furthermore, the lowpass filter 10b for maintaining at a grounding potential the node C which is a connection point between the resistors 16 and 17 is arranged on the side of the low voltage power source Vee. On the other hand, in FIG. 7 showing the second embodiment, the lowpass filter 10a is arranged on the side of the low voltage Vee with respect to the MR element 1 while the lowpass filter 10b is arranged on the side of the high voltage power source Vcc.

In such a constitution, in the same manner as the first embodiment, a stable signal which varies a little with respect to the high frequency input signal can be taken out. Furthermore, an MR element bias current circuit can be obtained which removes noises at a sufficiently low cut-off frequency by constituting inside of an IC a lowpass filter comprising a trans-conductance amplifier, and a capacitor having a relatively small size.

The third embodiment of the present invention will be explained below with the help of FIG. 8.

In FIG. 1, one MR element 1 is shown as a representative MR element. However, in actual hard disk drive, it often happens that one out of a plurality of MR elements is selected and used which is biased by sharing a signal amplification portion (after the differential amplifying circuit 2).

It is necessary to change the MR bias current in accordance with the characteristics (resistance, inductance, parasitic capacitance or the like) of the MR element. Every time the selected element is changed over, it is necessary to set a bias current for each of the elements. Furthermore, when the MR current begins to flow from the cut-off state in order to change over a mode to a signal reading mode from a state of writing a signal on a magnetic disc or in a power-save state, a time for the setting of such a bias current or for the start of the flow of bias current serves as a time of interrupting a signal reading operation. Consequently, a high speed access to a disc drive can be realized by shortening this interruption time.

Figure 8:
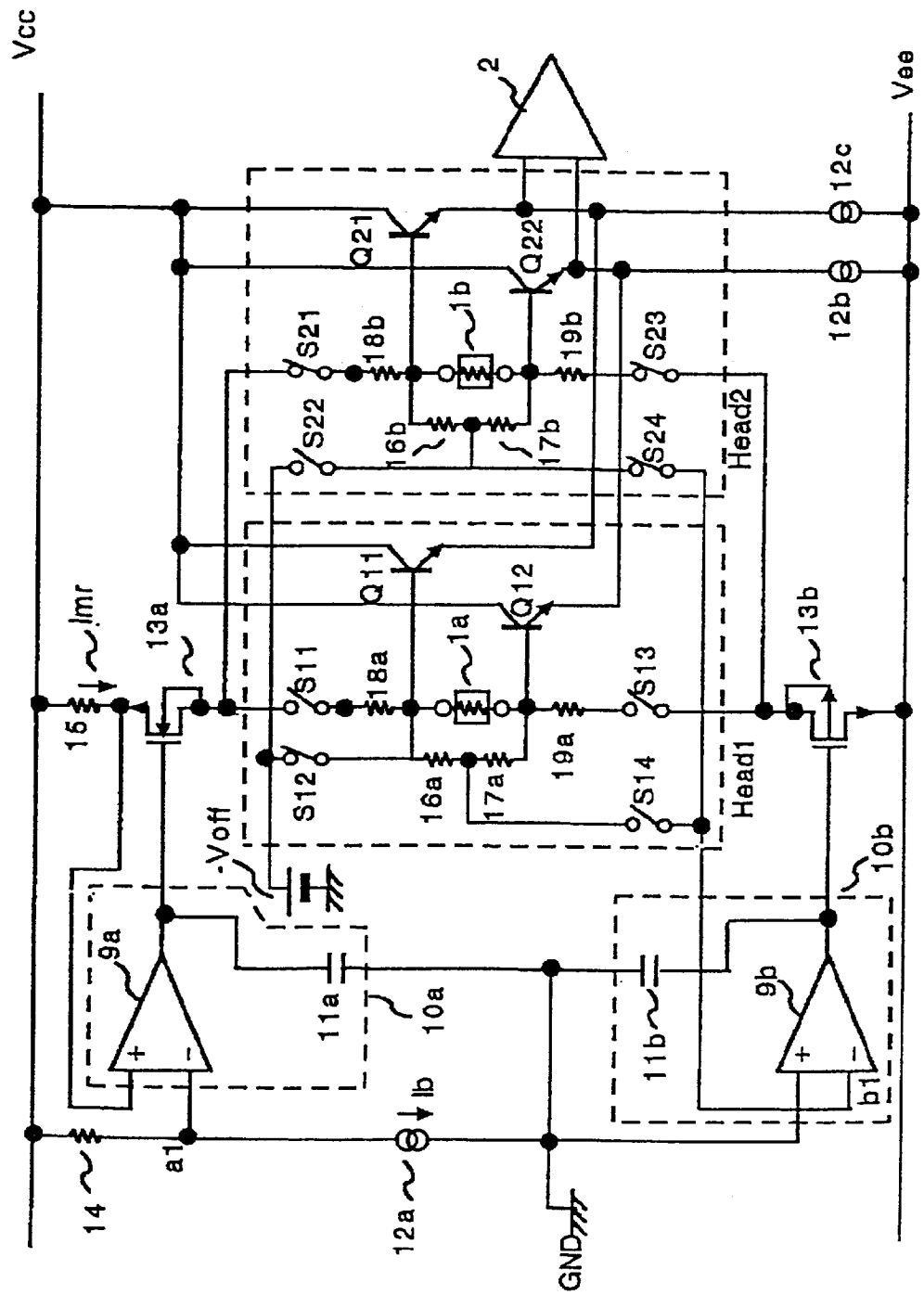
FIG. 8 is a circuit diagram showing a differential amplifying circuit according to a third embodiment of the present invention.

The circuit shown in FIG. 1 is a circuit for the signal amplification of one MR element, whereas the circuit shown in FIG. 8 is an MR element signal amplification circuit for dealing with a plurality of MR elements.

Reference numerals 1a and 1b denote MR elements. Reference numeral 2 denotes a differential amplifying circuit. Reference numerals 10a and 10b denote lowpass filters comprising trans-conductance amplifier amplifiers 9a and 9b, and capacitors 11a and 11b. Reference numerals 12a, 12b and 12c denote a rectified current circuit. Reference numerals 13a and 13b denote MOS transistors. Reference numerals 14, 15, 16a, 16b, 17a, 17b, 18a, 18b, 19a and 19b denote resistors. Reference numerals S11, S12, S13, S14, S21, S22, S23 and S24 denote switches. Furthermore, reference numerals Q11, Q12, Q21 and Q22 denote NPN transistors.

The advantages and the operations of the circuit shown in FIG. 3 is the same as the one shown in FIG. 1. However, either MR element 1a or MR element 1b can be selected with ON and OFF of the switches S11 through S14 and S21 through S24. For reference, FIG. 8 shows a state in which MR element 1b is selected.

Since the present invention is constituted in the manner that has been explained above, the following advantage can be obtained.

In the MR element signal amplifying circuit according to the present invention, since the first resistor is connected to one end and the second resistor is connected to the other end of the MR element and the remaining ends of the first and the second resistors are connected to the source terminal of the MOS transistor, a stable signal which varies a little with respect to the input signal having a high frequency can be taken out.

Furthermore, the MR element signal amplifying circuit according to the present invention, a plurality of MR elements are provided, the first resistor is connected to one end and the second resistor to the other end of each of the plurality of MR elements and the remaining ends of the first and the second resistor are connected to the source terminal of the MOS transistor, and furthermore the MR element signal amplifying circuit comprises a selection circuit selecting one of the plurality of MR elements and amplifying the signal of this MR element. Thus, a stable signal which varies a little with respect to the input signal having a high frequency can be taken out from the plurality of the MR element.

Furthermore, in the MR element signal amplifying circuit according to the present invention, there is further provided a first lowpass filter for removing noises which comprises a first trans-conductance amplifier and a first capacitor and which is capable of changing over the time constant with the change-over of the current of the first trans-conductance amplifier with the result that an MR element bias current circuit can be obtained for removing noises at a sufficiently low cut-off frequency.

Furthermore, in the MR element signal amplifying circuit according to the present invention, since an output of the first lowpass filter is connected to a base of the MOS transistor, and furthermore, the drain terminal of the MOS transistor is connected to the non-inversion input terminal of the first trans-conductance amplifier which constitutes the first lowpass filter, the MR element bias current circuit can be obtained for removing noises at a sufficiently low cut-off frequency.

Furthermore, in the MR element signal amplifying circuit according to the present invention, a third and fourth resistor elements having an equal size which are connected in series are connected to both ends of the MR elements, the node of the third and fourth resistor elements and the non-inversion input terminals of the second trans-conductance amplifier are connected to each other, the non-inversion input terminals of the second trans-conductance amplifier is connected to the ground, and the second trans-conductance amplifier and the second capacitor constitute the second lowpass filter, there is no fear that the MR element is damaged at the time of the short circuit of the MR element and the GND potential.

Furthermore, in the MR element signal amplifying circuit according to the present invention, since the bias circuit and the first lowpass filter are constituted at least in the same IC, the system can be constituted in a compact size at the time of the constitution thereof.

Furthermore, in the MR element signal amplifying circuit according to the present invention, since the bias circuit and the second lowpass filter are constituted at least in the same IC, the system can be constituted in a compact size at the time of the constitution thereof.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A magneto-resistive (MR) element signal amplifying circuit comprising:
   an MR element having first and second terminals;
   a differential amplifying circuit which amplifies a voltage generated at the first and second terminals of said MR element and outputs an amplified voltage;
   a bias circuit providing a bias current to said MR element and including:
      a first resistor having a first end connected to the first terminal of said MR element and a second resistor having a first end connected to the second terminal of said MR element; and
      first and second MOS transistors having respective sources, gates, and drains, wherein second ends of said first and second resistors are respectively connected to the sources of said first and second MOS transistors.

2. The MR element signal amplifying circuit according to claim 1 further comprising a first lowpass filter including a first trans-conductance amplifier and a first capacitor for changing a time constant upon a change of current produced by said first trans-conductance amplifier.

3. The MR element signal amplifying circuit according to claim 2, wherein an output of said first lowpass filter is connected to the gate of said first MOS transistor, and the drain of said first MOS transistor is further connected to a non-inverting input terminal of said first trans-conductance amplifier.

4. The MR element signal amplifying circuit according to claim 2, wherein at least said bias circuit and said first lowpass filter are part of a single integrated circuit.

5. The MR element signal amplifying circuit according to claim 1, including a second trans-conductance amplifier and third and fourth resistors having identical resistances, the third and fourth resistors being connected in series and connected to the first and second terminals of said MR element, a node between said third and fourth resistors and an inverting input terminal of said second trans-conductance amplifier being connected to each other, a non-inverting input terminal of said second trans-conductance amplifier being connected to ground, and further including a second capacitor, said second trans-conductance amplifier and said second capacitor further comprising a second lowpass filter.

6. The MR element signal amplifying circuit according to claim 5, wherein at least said bias circuit and said second lowpass filter are part of a single integrated circuit.

7. A magneto-resistive (MR) element signal amplifying circuit comprising:

a plurality of MR elements having first and second terminals;

a differential amplifying circuit which amplifies voltages generated at the first and second terminals of said MR elements and outputs an amplified voltage;

respective bias circuits providing bias currents to said MR elements and including:
   first and second MOS transistors having respective sources, drains, and gates; and
   first and second resistors having respective first and second ends, the first ends being connected to respective terminals of a respective MR element, and the second ends of said first and second resistors being connected to the sources of said first and second MOS transistors; and a selection circuit for selecting one of said plurality of MR elements and amplifying a signal from the MR element selected.

8. The MR element signal amplifying circuit according to claim 7 further comprising a first lowpass filter including a first trans-conductance amplifier and a first capacitor for changing a time constant upon a change of current produced by said first trans-conductance amplifier.

9. The MR element signal amplifying circuit according to claim 8, wherein an output of said first lowpass filter is connected to the gate of said first MOS transistor, and the drain of said first MOS transistor is further connected to a non-inverting input terminal of said first trans-conductance amplifier.

10. The MR element signal amplifying circuit according to claim 8, wherein at least said bias circuit and said first lowpass filter are part of a single integrated circuit.

11. The MR element signal amplifying circuit according to claim 7, including a second trans-conductance amplifier and third and fourth resistors having identical resistances, the third and fourth resistors being connected in series and connected to the first and second terminals of said MR element, a node between said third and fourth resistors and an inverting input terminal of said second trans-conductance amplifier being connected to each other, a non-inverting input terminal of said second trans-conductance amplifier being connected to ground, and further including a second capacitor, said second trans-conductance amplifier and said second capacitor further comprising a second lowpass filter.

12. The MR element signal amplifying circuit according to claim 11, wherein at least said bias circuit and said second lowpass filter are part of a single integrated circuit.

* * * * *